United States Patent [19]
Lai

[11] Patent Number: 5,509,465
[45] Date of Patent: Apr. 23, 1996

[54] HEAT-DISSIPATING DEVICE FOR A CENTRAL PROCESSING UNIT CHIP

[75] Inventor: Yaw-Huey Lai, Taipei, Taiwan

[73] Assignee: Bioli Corporation, Taipei, Taiwan

[21] Appl. No.: 401,832

[22] Filed: Mar. 10, 1995

[51] Int. Cl.⁶ .............................. F28F 7/00; H05K 7/20
[52] U.S. Cl. .................... 165/80.3; 165/121; 165/185; 174/16.3; 257/718; 257/719; 361/697; 361/704
[58] Field of Search .................................. 165/80.3, 185, 165/121; 174/16.3; 257/718, 719, 722; 361/695, 697, 703, 704

[56] References Cited

U.S. PATENT DOCUMENTS

| | | | |
|---|---|---|---|
| 3,246,213 | 4/1966 | Hannan | 257/722 |
| 3,471,757 | 10/1969 | Sias | 174/16.3 X |
| 4,777,560 | 10/1988 | Herrell et al. | 174/16.3 X |
| 5,020,586 | 6/1991 | Masingh | 165/80.3 |

*Primary Examiner*—Leonard R. Leo
*Attorney, Agent, or Firm*—Townsend and Townsend and Crew

[57] ABSTRACT

A heat-dissipating device for a central processing unit chip includes a plurality of heat-dissipating fins. Each fin has at least one through-hole, a lower edge, and a flange connected perpendicularly to the lower edge. At least one rod member passes through the through-hole of the fins so that the fins can be stacked together and spaced apart from one another by the flanges of the fins, with the lower edges of the fins being co-planar. Two connecting members are connected detachably to the two outermost fins. Two ends of the rod member pass through the connecting members. Each of the connecting members has a clamping portion which clamps onto the lower face of the chip so that the upper face of the chip can abut the lower edges of the fins.

4 Claims, 3 Drawing Sheets

HEAT-DISSIPATING DEVICE FOR A CENTRAL PROCESSING UNIT CHIP

BACKGROUND OF THE INVENTION

1. Field of the Invention

This invention relates to a heat-dissipating device, more particular to a heat-dissipating device for a central processing unit chip.

2. Description of the Related Art

Referring to FIG. 1, a first type of conventional heat-dissipating device for a central processing unit chip is shown to comprise a base plate 1 to be connected to the chip (not shown) and a plurality of heat-dissipating fins 10 formed integrally on the upper side of the base plate 1. The first type of conventional heat-dissipating device is formed by means of cutting an elongated aluminum extrusion. FIG. 2 shows a second type of conventional heat-dissipating device for a central processing unit chip which includes a plurality of heat-dissipating fins 2 and engaging members 3 integrally formed with the fins 2. The fins 2 are formed by means of cutting an elongated aluminum extrusion. The engaging members 3 is used to connect the chip (not shown). An axial fan 4 is fixed to the upper edges of the fins 2 in order to facilitate the heat-dissipating effects. The above-mentioned conventional heat-dissipating devices suffer from the following disadvantages:

(1) It is known that the greater the number or the height of the fins, the better the heat-dissipating effects are. However, it is difficult to form the fins by cutting when the height of the fins to be formed is large. In addition, the fins are liable to deformed when being formed by cutting.

(2) The manufacturers must make different sizes of heat-dissipating devices for different sizes of central processing unit chips. This results in a considerable cost for dies which are used to make different sizes of aluminum extrusions, increasing the manufacturing costs.

SUMMARY OF THE INVENTION

It is an object of this invention to provide a heat-dissipating device for a central processing unit chip which can save the cost of dies, reducing the manufacturing costs.

It is another object of this invention to provide a heat-dissipating device for a central processing unit chip in which the fins can have a greater number and height, and can be produced without cutting processes.

Accordingly, the heat-dissipating device for a central processing unit chip of this invention comprises:

a plurality of heat-dissipating fins, each fin having at least one through-hole, a lower edge, and a flange connected perpendicularly to the lower edge;

at least one rod member passing through the through-hole of the fins so that the fins can be stacked together and spaced apart from one another by the flanges of the fins, with the lower edges of the fins being co-planar; and two connecting members connected detachably to the two outermost fins, two ends of the rod member passing respectively through the connecting members, each connecting member having a clamping portion which clamps onto the lower face of the central processing unit chip so that the upper face of the central processing unit chip can abut the lower edges of the fins.

Whereby, the size of the heat-dissipating device can be adjusted in order to be mounted on different sizes of chips by increasing or decreasing the number of the fins or the space between the fins. Therefore, there is no need to prepare a variety of dies of different sizes, dramatically reducing the manufacturing costs.

Preferably, a powered axial fan is mounted on the upper edges of the fins in order to produce a forced convection which enhance the heat-dissipating efficiency of the fins.

BRIEF DESCRIPTION OF THE DRAWINGS

Other features and advantages of this invention will become apparent in the following detailed description of the preferred embodiments of this invention with reference to the accompanying drawings, in which like numerals identify like elements in the figures and in which.

DETAILED DESCRIPTION OF THE PREFERRED EMBODIMENTS

Figure 1:
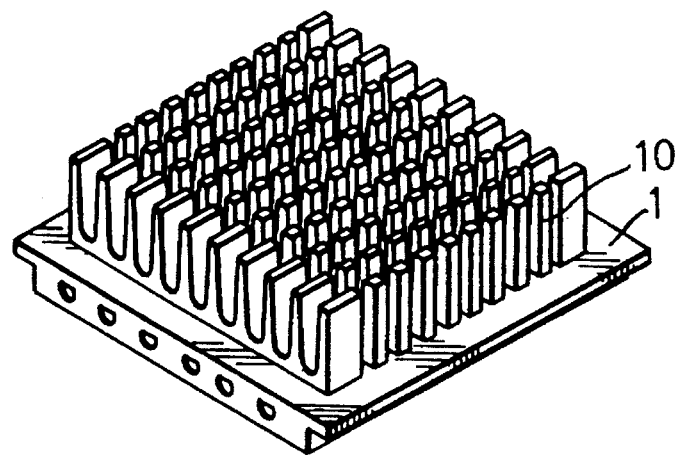
FIG. 1 is a perspective view of a first type of conventional heat-dissipating device.
Figure 2:
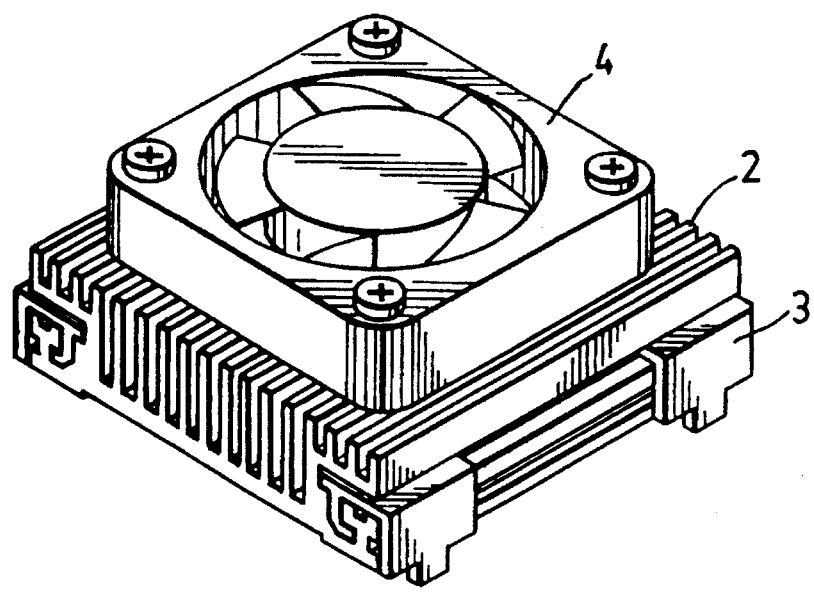
FIG. 2 is a perspective view of a second type of conventional heat-dissipating device.
Figure 3:
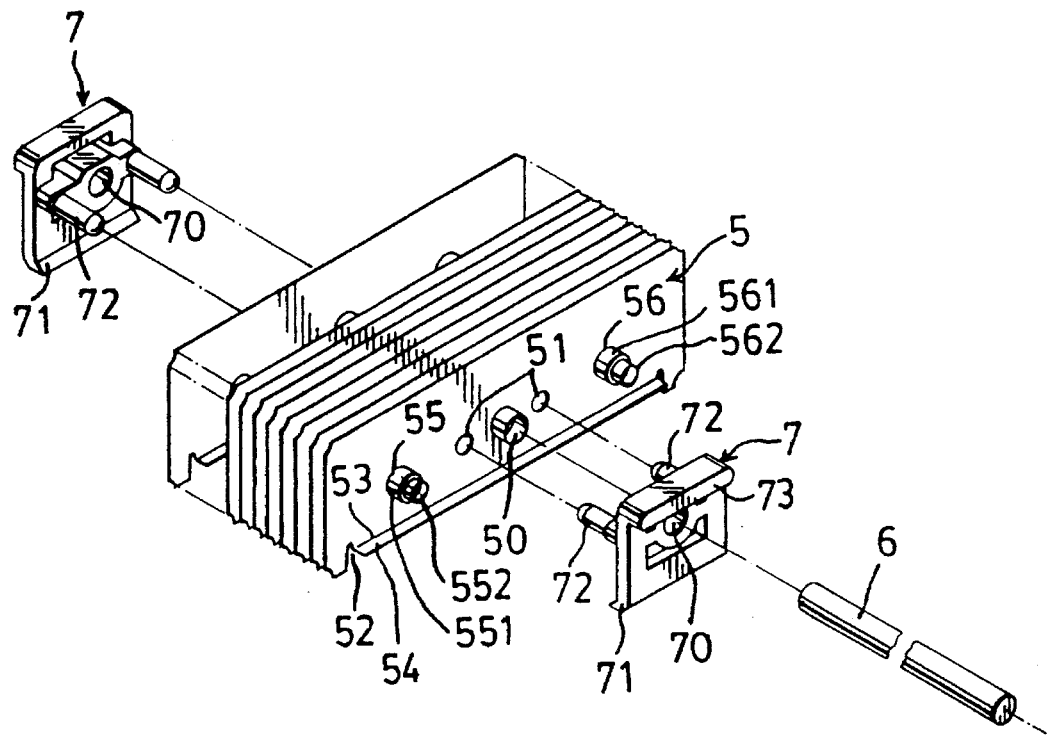
FIG. 3 is an exploded perspective view of a first preferred embodiment of a heat-dissipating device of this invention.

Referring to FIG. 3, a first preferred embodiment of a heat-dissipating device of this invention is shown to comprise a plurality of heat-dissipating fins 5, a rod member 6 and two connecting members 7.

Figure 4:
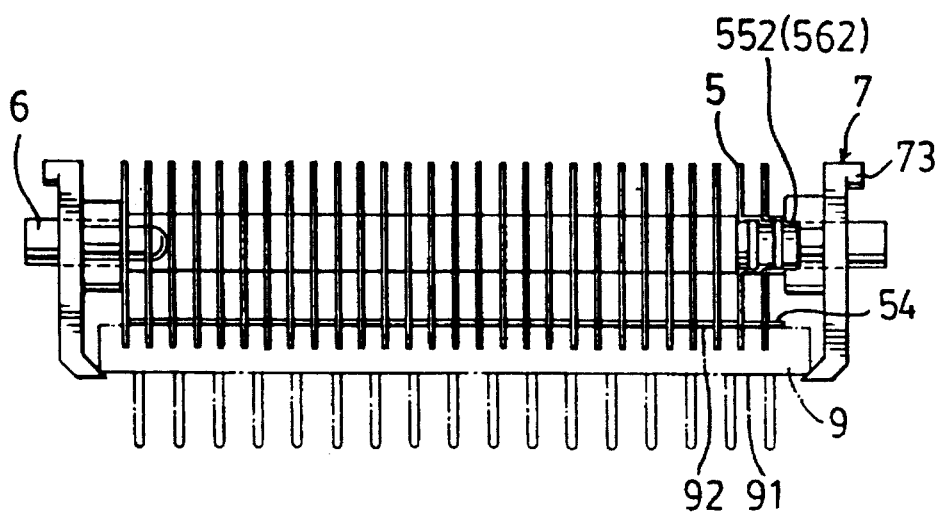
FIG. 4 is schematic side view illustrating the first preferred embodiment of the heat-dissipating device the of this invention which is mounted on a central processing unit chip.

Each of the fins 5 has a through-hole 50 and a flange 54 which is connected perpendicularly to the lower edge 53 of the fin 5. The lower edge 53 of each fin 5 has a notch 52 which receives and engages the upper portion of a central processing unit chip 9, as best illustrated in FIG. 4. The rod member 6 passes through the through-hole 51 of the fins 5 so that the fins 5 can be stacked together and spaced apart from one another by the flanges 54 of the fins 5, with the lower edges 53 of the fins 5 being on the same plane. Each of the fins 5 further has first and second apertures 55 and 56, and two positioning tube members 551 and 561 connected to the first and second apertures 55 and 56 respectively. The first apertures 55 are aligned and the second apertures 56 are aligned. Each of the positioning tube members 551 and 561 has a diameter-reduced end 552 (562) which is inserted into an adjacent positioning member 551 (561) of an adjacent fin 5. This allows the fins 5 to engage one anther, and prevents the fins 5 from being rotated about the rod member 6 relative one another in order to keep the lower edges 53 on the same plane.

Each of the connecting members 7 is in the form of a plate member with a central bore 70 through which the two ends of the rod member 6 pass, and two connecting rods 72 which insert into and engage two connecting holes 51 of each fin 5.

Each connecting member 7 further has a clamping portion 71 which is formed on its lower edge. The clamping portions 71 of the connecting members 7 are in the form of hooks and clamp onto the lower face 91 of the central processing unit chip 9 so that the upper face 92 of the central processing unit chip 9 can abut the lower edges 53 of the fins 5, as best illustrated in FIG. 4. Preferably, a heat-dissipating glue (not shown) is applied to the lower edges 53 of the fins so that the fins 5 can adhere to the chip 9. Therefore, the heat produced in the chip 9 can be transferred to the fins 5 of the heat-dissipating device and can dissipate therefrom.

Figure 5:
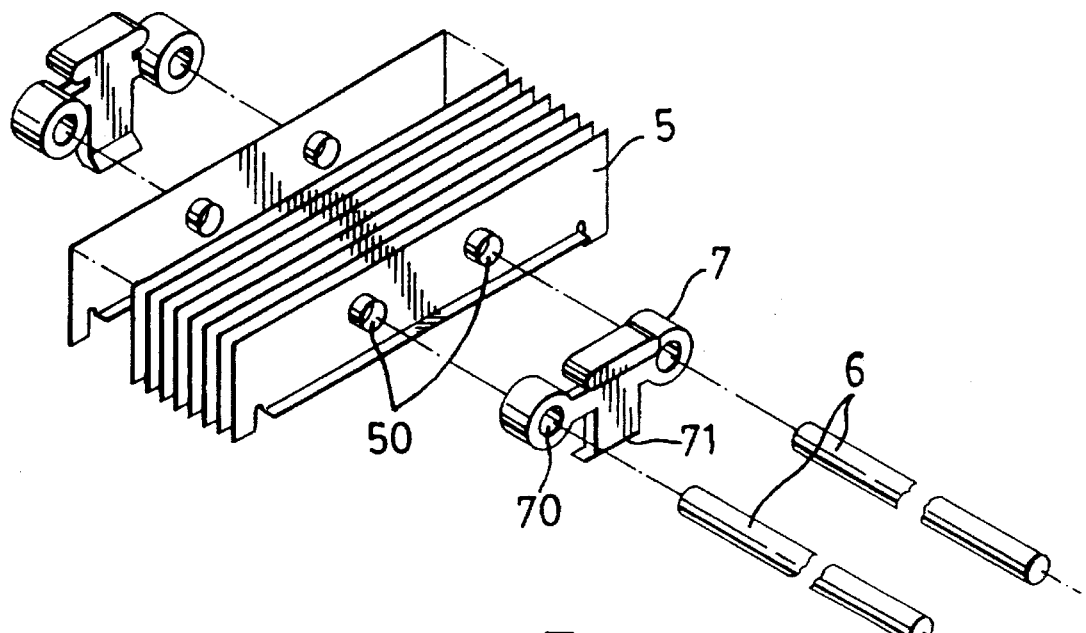
FIG. 5 is an exploded perspective view of a second preferred embodiment of a heat-dissipating device of this invention.

Referring to FIG. 5, a second preferred embodiment of a heat-dissipating device of this invention is shown to comprise a plurality of heat-dissipating fins 5 similar to those of the first embodiment. Two rod members 6 pass through the through-holes 50 so that the fins 5 are stacked together in a similar manner to those in the first embodiment, and are prevented from rotating relative to one another when the fins are mounted on the chip 9. Two connecting members 7 are detachably connected to the two outermost fins of the heat-dissipating device. Each of the connecting members 7 has two bores 70 through which the two rod members 6 pass, and a clamping portion 71 which is used to clamp to the lower face of a chip (not shown in FIG. 5).

Figure 6:
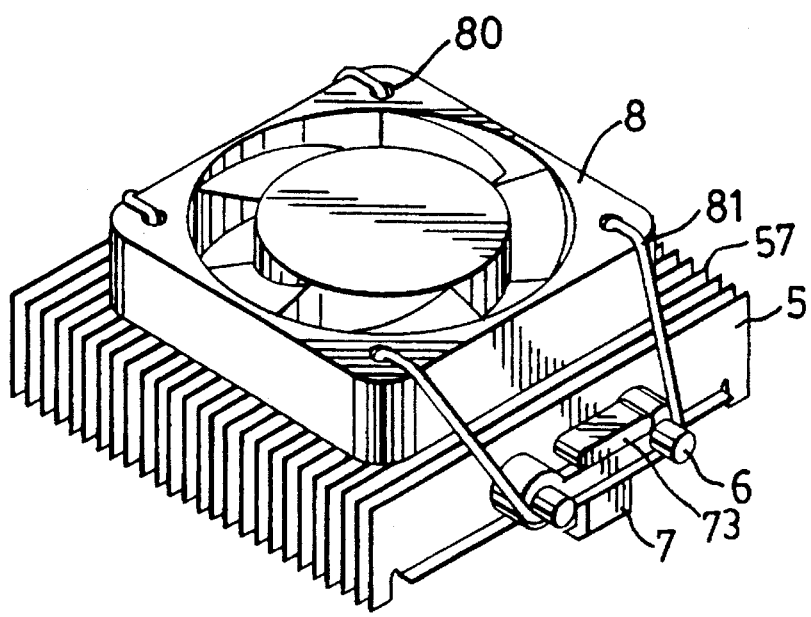
FIG. 6 is a perspective view illustrating an axial fan being mounted on the second preferred embodiment of a heat-dissipating device of this invention.

Referring to FIG. 6, an axial fan 8 is preferably mounted on the upper edges 57 of the fins 5 by means of two retaining hooks 81. The retaining hooks 81 interconnect the holes 80 in the housing of the axial fan 8 and the ends of the rod members 6. Thereby, a forced convection of heat may be provided by the use of the axial fan 8 in order to enhance the heat-dissipating efficiency of the fins 5.

The advantages of the heat-dissipating device of the present invention are as follows:

(1) The number of, and the space between, the fins 5 can be varied in order to match the chips 9 of different sizes without the need to make different dies. Therefore, the manufacturing costs can be dramatically reduced. In addition, the stacked fins of the heat-dissipating device can be formed without cutting processes. Therefore, the fins cannot be deformed by cutting processes.

(2) The heat-dissipating device can be easily and conveniently detached from the chip 9 by depressing the upper sides 73 (see FIGS. 3 to 6) of the connecting members which is opposite to the clamping portions 71 in order to force the clamping portions 71 to disengage the lower face 91 of the chip 9. One or more fins can be added to or removed from the rod member 6 after one of the connecting members 7 is detached from the rod. After adjustment of the number of, or the gap between, the fins is completed and the connecting members 7 are connected to the fins 5, the heat-dissipating device can be mounted on the chip 9 by depressing the upper sides 73 to force the clamping portions 71 to move outward, allowing the upper face 92 of the chip 9 to abut the lower edges 53 of the fins 5, and then releasing the upper sides 73 to allow the clamping portions 71 to engage the lower face 91 of the chip 9. Therefore, the heat-dissipating device can be easily and conveniently mounted on or detached from the chip 9.

With this invention thus explained, it is apparent that numerous modifications and variations can be made without departing from the scope and spirit of this invention. It is therefore intended that this invention be limited only as indicated in the appended claims.

I claim:

1. A heat-dissipating device for a central processing unit chip, the heat-dissipating device comprising:

a plurality of heat-dissipating fins, each of said fins having at least one through-hole, a lower edge, and a flange connected perpendicularly to said lower edge;

at least one rod member passing through said through-hole of said fins so that said fins can be stacked together and spaced apart from one another by said flanges, with said lower edges of said fins being co-planar; and two connecting members connected detachably and respectively to two outermost fins, two ends of said rod member passing respectively through said connecting members, each of said connecting members having a clamping portion which clamps onto a lower face of said central processing unit chip so that an upper face of said central processing unit chip can abut said lower edges of said fins.

2. A heat-dissipating device as claimed in claim 1, wherein said lower edge of each of said fins has a notch which receives and engages an upper portion of said central processing unit chip.

3. A heat-dissipating device as claimed in claim 1, wherein each of said fins has an upper edge, said upper edges of said fins being coplanar and having an axial fan mounted thereon.

4. A heat-dissipating device as claimed in claim 1, wherein each of said fins has first and second apertures, and two positioning tube members connected to said first and second apertures, said first apertures being aligned and said second apertures being aligned one another, each of said positioning tube members having a diameter-reduced end which is inserted into an adjacent positioning member of an adjacent fin.

* * * * *